United States Patent [19]
Hibbitt et al.

[11] Patent Number: 5,920,491
[45] Date of Patent: Jul. 6, 1999

[54] COMPUTER PROCESS FOR PRESCRIBING AN ASSEMBLY LOAD TO PROVIDE PRE-TENSIONING SIMULATION IN THE DESIGN ANALYSIS OF LOAD-BEARING STRUCTURES

[75] Inventors: Hugh David Hibbitt, Bristol; Joop C. Nagtegaal, Barrington, both of R.I.

[73] Assignee: Hibbitt, Karlsson and Sorenson, Inc., Pawtucket, R.I.

[21] Appl. No.: 08/783,139

[22] Filed: Jan. 14, 1997

[51] Int. Cl.$^6$ .................................................... G06F 17/10
[52] U.S. Cl. ............... 364/578; 364/468.03; 364/468.04; 364/735; 364/736.03
[58] Field of Search ............................. 364/468.02, 578, 364/488, 165; 395/920

[56] References Cited

U.S. PATENT DOCUMENTS 5,729,462  3/1998  Newkirk et al. ................... 364/468.03

OTHER PUBLICATIONS

ABAQUS Theory Manual, Version 5.5, Hibbitt, Karlsson & Sorenson, Inc. 1995.
ABAQUS/Standard User's Manual, vol. I, Version 5.5, Hibbitt, Karlsson & Sorensen, Inc. 1995.
ABAQUS/Standard User's Manual, vol. II, Version 5.5, Hibbitt, Karlsson & Sorensen, Inc. 1995.
ABAQUS/Standard Verification Manual, Version 5.5, Hibbitt, Karlsson & Sorensen, Inc. 1995.
ABAQUS/Standard Example Problems Manual, vol. I, Version 5.5, Hibbitt, Karlsson & Sorensen, Inc. 1995.
ABAQUS/Post Manual, Version 5.5, Hibbitt, Karlsson & Sorensen, 1995.

*Primary Examiner*—Kevin J. Teska
*Assistant Examiner*—Lonnie A. Knox
*Attorney, Agent, or Firm*—Irah H. Donner; Pepper Hamilton LLP

[57] ABSTRACT

A computer implemented process simulates the application of a tension force in an element of an assembly. The process defines a finite element model for the element, and creates a pre-tension surface in the finite element model of the element for applying the tension force. Conditions are prescribed relative to the pre-tension surface for applying the tension force in the simulation. The conditions include prescribing an assembly load including either a tension force or tightening adjustment. The assembly load is then applied to the pre-tension surface of the element to simulate the tension in the element of the assembly. The results of the simulation are then evaluated for structural integrity, and subsequent structural redesign of the element is performed when necessary.

19 Claims, 15 Drawing Sheets

5,920,491

COMPUTER PROCESS FOR PRESCRIBING AN ASSEMBLY LOAD TO PROVIDE PRE-TENSIONING SIMULATION IN THE DESIGN ANALYSIS OF LOAD-BEARING STRUCTURES

FIELD OF THE INVENTION

The present invention is generally related to analysis of structural integrity of structures via computer implemented simulation, and more particularly to analysis and design of integrity of structures via computer implemented simulation by prescribing an assembly load using a pre-tensioning capability.

BACKGROUND OF THE RELATED ART

There is no known direct procedure available that allows a user to prescribe assembly loads for analyzing the integrity of a structure via computer implemented simulation. For example, in many situations fasteners that are used to assemble a structure must be affixed or fastened to the structure at a particular tension. If the fastener is affixed with too little tension it may provide too much vibration or movement in the structure causing the structure to be unstable, or may permit undesirable leakage through the gaskets. On the other hand, if the fastener is affixed too tightly, the fastener might break or cause damage to the structure. Thus, it is important that the fastener be affixed with the appropriate amount of tension.

One common example is the need for careful assembly of an automobile engine to run without leakage of gases or coolant. Automobile engines generally provide peak performance when the engine has "warmed up." In this situation, the engine becomes heated, along with the various elements or fasteners that are used in the engine. Therefore, the fasteners must be properly tensioned to hold the component correctly assembled without undue stress throughout the cycle of usage.

This process of properly tensioning the engine elements generally requires a significant amount of trial and error. This process is quite time consuming and can only be performed by technicians that are very familiar with engine tuning. Therefore, it is highly desirable to determine the optimal tensioning of the engine elements through computer simulation.

FIG. 1 is a simple example which illustrates the concept of an assembly load. In FIG. 1, cavity 2 is designed to be a sealed cavity. This is accomplished by placing the gasket 4 under pressure, which is done by initially pre-tensioning bolt 6 to a prescribed load value when connecting with flange 1. The pre-tension section 8 of the bolt 6, represented in FIG. 1, is then subjected to a tension load.

We have therefore realized that it is desirable to simulate the tightening of fasteners that are used to assemble a structure using a pre-tensioning capability.

We have also determined that it is desirable to apply a preload across the pre-tension section to simulate the tightening of a fastener for structural analysis and design.

We have further discovered that it is desirable to apply a tightening adjustment (displacement) of the pre-tension section, which also results in a preload of the fastener, to simulate the tightening of a fastener for structural analysis and design.

We have further realized that it is desirable to maintain the tightening adjustment so that the load across the fastener may increase or decrease upon loading of the entire structure during a sequence of loading steps that must be followed to perform structural analysis and design.

SUMMARY OF THE INVENTION

It is a feature and advantage of the present invention to simulate the tightening of fasteners that are used to assemble a structure using a pre-tensioning capability.

It is another feature and advantage of the present invention to apply a prescribed preload across the pre-tension section to simulate the tightening of a fastener for structural analysis and design.

It is another feature and advantage of the present invention to apply a tightening adjustment (displacement) at the pre-tension section, which also results in a preload of the fastener, to simulate the tightening of a fastener for structural analysis and design.

It is another feature and advantage of the present invention to maintain the tightening adjustment so that the load across the fastener may increase or decrease upon loading of the entire structure during a sequence of loading steps that must be followed to perform structural analysis and design.

The present invention is based, in part, on our discovery that it is possible to simulate the pre-tension force on a fastening element in any direction without modeling the fastening element as two separate pieces, and without modifying the modeling of the structure of the fastening element. The present invention thus provides simulation of the fastening element with a prescribed tension or tightening adjustment using a standard finite element model of the fastener.

We have further discovered that a force value in any direction for the fastening element can be prescribed as one of several prescribed boundary conditions in the model. The present invention also captures load paths associated with the pre-tension force of the fastening element. In addition, the present invention is able to prescribe and measure the resulting forces and moments on the fastening element in any direction resulting from the pre-tension force to determine structural integrity and design.

The computer implemented process for prescribing an assembly load to provide pre-tensioning simulation has the ability to prescribe a tension or tightening adjustment in a member or fastener of an assembly as one of the prescribed boundary conditions in a finite element model. The computer implemented process also has the ability to prescribe the tension in a member or fastener of a structure without modifying the basic finite element model for the member or fastener.

The computer implemented process is designed to allow the same technique to be used to measure forces and moments transmitted by any component in an assembly or structure modeled as a general finite element model. The computer implemented process also has the ability to prescribe and measure successive forces in the same component or element for the same simulation model, and independently in any and all components in the simulation model for structural analysis and design.

In accordance with one embodiment of the invention, a computer implemented process simulates the application of a tension force in an element of an assembly. The process defines a finite element model for the element, and creates a pre-tension surface in the finite element model of the element for applying the tension force. Conditions are prescribed relative to the pre-tension surface for applying the tension force in the simulation. The conditions include prescribing an assembly load which includes either a tension force or a tightening adjustment. The assembly load is then applied to the pre-tension surface of the element to simulate the tension in the element of the assembly. The results of the simulation are then evaluated for structural integrity, and subsequent structural redesign is performed when necessary.

In accordance with another embodiment, a computer readable tangible medium stores instructions for implementing a process driven by a computer. The instructions control the computer to perform the process of simulating a tension in an element of an assembly, as described in detail below.

The computer implemented process may be performed using a plurality of tension forces applied to a plurality of elements in an assembly. The computer implemented process may also be performed using a standard finite element model while prescribing these assembly loads as several of the boundary conditions.

These together with other objects and advantages which will be subsequently apparent, reside in the details of construction and operation as more fully herein described and claimed, with reference being had to the accompanying drawings forming a part hereof wherein like numerals refer to like elements throughout.

NOTATIONS AND NOMENCLATURE

Figure 1:
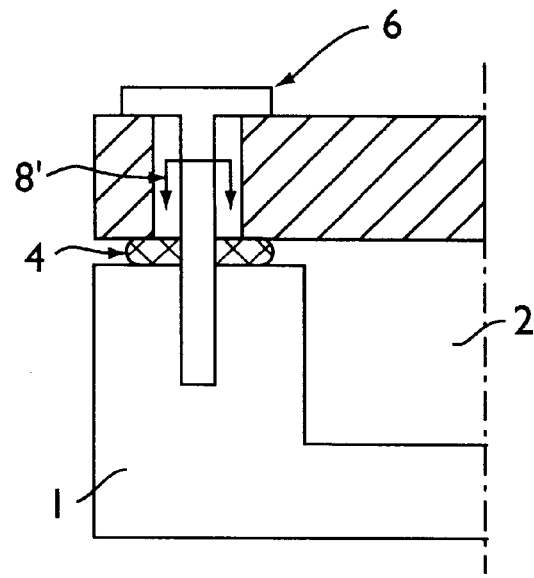
FIG. 1 is a simple example which illustrates the concept of an assembly load.

The detailed descriptions which follow may be presented in terms of program procedures executed on a computer or network of computers. These procedural descriptions and representations are the means used by those skilled in the art to most effectively convey the substance of their work to others skilled in the art.

A procedure is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operation of the present invention include general purpose digital computers or similar devices.

The present invention also relates to apparatus for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove more convenient to construct more specialized apparatus to perform the required method steps. The required structure for a variety of these machines will appear from the description given.

BEST MODE FOR CARRYING OUT THE INVENTION

Pre-tension force is simulated on a fastening element in any direction without modeling the fastening element as two separate pieces, and without modifying the structure of the fastening element. A fastening element is identified by means of a pre-tension section across which a desired load is applied to tighten the fastener. The fastening element is simulated with a prescribed tension using a standard finite element model of the fastener. A force value in any direction for the fastening element is prescribed as one of several prescribed boundary conditions in the model. Load paths associated with the pre-tension force of the fastening element are also captured.

Resulting forces on the fastening element are prescribed and measured in any direction resulting from the pre-tension force to determine structural integrity and design. A tensile force is prescribed in a member or fastener of an assembly as one of the prescribed boundary conditions in a finite element model without modifying the basic finite element model for the member or fastener.

The same technique may be used to measure forces and moments transmitted by any component in an assembly or structure modeled as a general finite element model. Successive forces are prescribed and measured in the same component or element for the same simulation model, and independently in any and all components in the simulation is model.

The pre-tension section is controlled with a "pre-tension node," which has only one degree of freedom and is used to:

Apply a preload across the pre-tension section;

Apply a tightening adjustment (displacement) of the pre-tension section, which also results in a preload of the fastener;

Maintain the tightening adjustment so that the load across the fastener may increase or de crease upon loading of the entire structure.

The load or tightening adjustment is provided along the normal to the pre-tension section. Pre-tension sections may be defined in fasteners modeled with:

Continuum elements

Beam or truss elements

If continuum elements are used to model the fastener, the pre-tension section is defined as a surface across the fastener.

The normal "n" to the pre-tension section:

By default is oriented in the direction of the positive surface normal.

May be given directly by the user, in which case the pre-tension section does not have to be orthogonal to the pre-tension direction.

The total force transmitted over the pre-tension section is the sum of the reaction force at the pre-tension node plus any concentrated load at that node. The stress distribution across the pre-tension section can be obtained in several ways, such as from the forces transmitted through the nodes on either side of the pre-tension section (such nodes are described further in the section "Prescribing an Assembly Load" below), or from the underlying elements (such underlying elements are described further in the section "Prescribing an Assembly Load" below). The tightening of the pre-tension section appears as the displacement of the pre-tension node.

If beam or truss elements are used to model the fastener, the pre-tension section is then chosen to be at one end of an element. The normal "n" to the pre-tension section:

By default is a unit vector oriented from the first node to the last node of the element.

May be given directly by the user.

PRESCRIBING AN ASSEMBLY LOAD

The following options are available for prescribing an assembly load for a fastener or element in a structure:

Using the Pre-Tension Section in Contact

Figure 2:
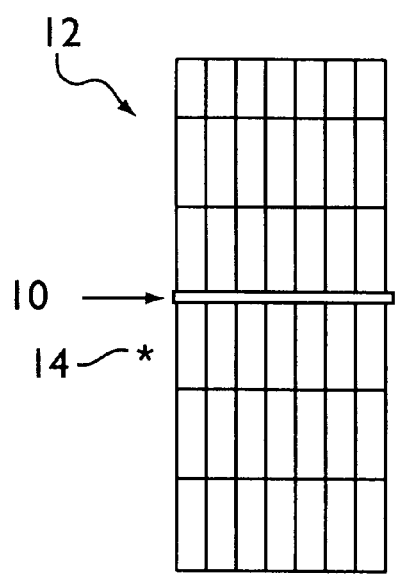
FIGS. 2 and 3 are illustrations of first and second methods of prescribing an assembly load.

The first method of prescribing an assembly load is illustrated in connection with FIGS. 2 and 3. In FIG. 2, the pre-tension section 10 for element 12 is defined by the user, along with a reference node 14. The user must define the pre-tension section/surface as a complete and continuous surface made up of finite element surfaces (or edges in two dimensional cases, or nodes if the element is modeled with truss or beam elements) cutting through the element as described in more detail below. The pre-tension section 10, which is internal to element 12, is then used to split that element 12 in two sections.

Figure 3:
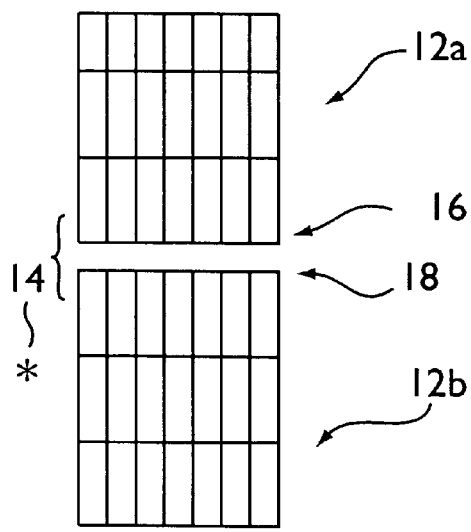

The result of splitting element 12 in two sections is shown in FIG. 3. As illustrated in FIG. 3, because of the split of element 12 into sections 12a, 12b, some extra nodes 16 are generated, and the original nodes on the pretension section 10 are shown as nodes 18. The pre-tension section 10 appears now in a matched pair of two surfaces, one of which contains the nodes 16, and the other contains the nodes 18. From this matched pair of surfaces, small-sliding elements are generated to which the reference node 14 of the pre-tension section 10 are added. This reference node 14 is then used to create the desired overclosure/transmitted force across the section 10.

The advantages of this first method are that it allows the user to have access to both the transmitted force (on the reference node), and the stresses across the section (via the contact stresses). The disadvantages of this method are that the user now has an unfamiliar mesh that may be difficult to understand with respect to overclosure of surfaces which were not there to begin with, and that the analysis cost would increase because of the standard Lagrange multipliers used for this model.

Imposing Multi-Point Constraint Across Pre-Tension Section

The second method of prescribing an assembly load is illustrated in connection again with FIG. 3. The concept of this method is very similar to the concept of the first method. As illustrated in FIG. 3, the element 12 which contains the pre-tension section 10 is split into two sections 12a, 12b, as explained above. However, instead of creating small-sliding elements at the contact pair, each of the nodes on one side of the surface 18 is constrained to the corresponding node on the other surface 16 using the multi-point constraint:

$$U_E - U_I = U_R$$

where U represents the displacement vector, E represents one of the nodes 18, I represents the corresponding node 16, and R represents the reference node 14. The pre-tension is then obtained by specifying a displacement or force at the reference node 14.

The pre-tension section force and tightening adjustment of the pre-tension section (displacement at the reference node 14) is directly available. Further processing is needed to obtain the stresses across the pre-tension section.

Here again the main disadvantages of this second method are that the user has an unfamiliar mesh, and that it may be difficult to understand the concept of overclosure of surfaces which have now been created. In addition, the extra nodes 16 that have been generated appear in the connectivity of the elements directly above the pre-tension surface, whereas the user expects these elements to contain the original nodes 18.

Altering Elements Underlying the Pre-Tension Section

The third method of prescribing an assembly load is illustrated in connection again with FIG. 4. The initial configuration looks the same as that depicted in FIG. 2. The pre-tension section 10 and the reference node 14 for section 10 are defined by the user. The finite elements in element 12 that have nodes on surface 10 are automatically separated by the procedure into those "above" and those "below" the surface.

Figure 4:
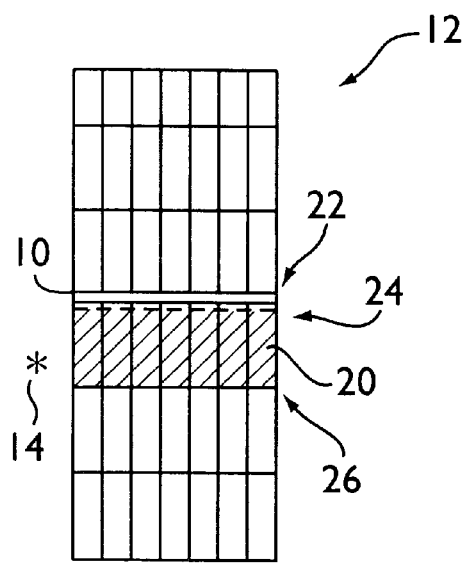
FIG. 4 is an illustration of a third method of prescribing an assembly load.

To simplify the discussion, assume that the finite elements 20 are below the pre-tension section 10, as shown in FIG. 4. These underlying finite elements 20 are altered internally in order to prescribe a pre-tension force across the section 10. This is done as follows: each element which originally contains nodes 22 (its active nodes on the pretension section 10) and remaining nodes 26, is internally assumed to contain the nodes 24 and 26. Nodes 24 are additional nodes originally coincident with the nodes 22. For convenience, nodes 24 may be added internally, so as not to be visible to the user. In addition, each of the nodes 24 is connected to a corresponding node 22 and the reference node 14 through the equation:

$$U_{A1} = U_A + U_R$$

where U represents the displacement vector, A1 represents one of the nodes 24, A represents the corresponding node 22, S represents remaining nodes 26 and R represents the reference node 14. This equation can be rewritten in matrix form to relate the nodes "A1" and "S" to the nodes "A", "S", and "R" as:

$$\left\{\frac{U_S}{U_{A1}}\right\} = \begin{bmatrix} 1 & 0 & 0 & | & 0 & 0 & 0 & | & 0 \\ 0 & 1 & 0 & | & 0 & 0 & 0 & | & 0 \\ 0 & 0 & 1 & | & 0 & 0 & 0 & | & 0 \\ - & - & - & | & - & - & - & | & - \\ 0 & 0 & 0 & | & 1 & 0 & 0 & | & 1 \\ 0 & 0 & 0 & | & 0 & 1 & 0 & | & 1 \\ 0 & 0 & 0 & | & 0 & 0 & 1 & | & 1 \end{bmatrix} \left\{\frac{U_S}{\frac{U_A}{U_R}}\right\} = [T]\left\{\frac{U_S}{\frac{U_A}{U_R}}\right\}$$

The original stiffness and right-hand side contribution for each finite element 20 therefore becomes:

$$[T]^T[K][T] \text{ and } [T]^T[F]$$

A pre-tension can then be prescribed by specifying a concentrated load or a displacement on the reference node "R". Note that the nodes "A1" are not really necessary in achieving the desired effect, but are only convenient in describing the process of augmenting the stiffness and right hand side contribution of the each underlying element. Indeed, the equation:

$$U_{A1} = U_A + U_R$$

could have also been written as:

$$U_A = U_A + U_R$$

and the same matrix transformation would have resulted (in the latter equation, the equal sign simply means replace as opposed to equal). As before, the force across the pre-tension section is retrievable from the force on node 14, and the tightening adjustment of the section corresponds to the displacement of the node 14. The stress distribution across the section is not directly available, but could be obtained if the nodes 24 are saved as a means of storing the portion of the assembly load which contributes to each node of the section.

Figure 5:
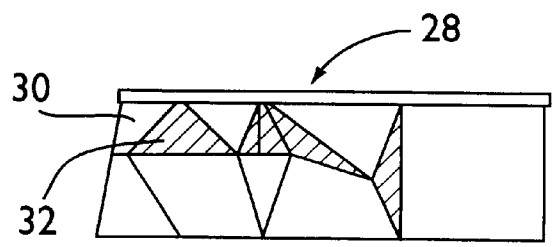
FIG. 5 illustrates a mesh that requires special treatment.

It is important to realize that all elements which are directly connected to the section (from below in our example) be subjected to the stiffness/right-hand side alteration. For example, FIG. 5 illustrates a mesh that includes some triangular elements. In FIG. 5, pre-tension section 28 includes elements 30 with edges on the pre-tension section 28, and also triangular elements 32 that only have vertices on the pre-tension section 28. The standard program ABAQUS, developed and distributed by Hibbitt, Karlsson & Sorensen, Inc., Pawtucket, R.I., generally selects the elements that need alterations based on a convenient definition of the pre-tension section 10.

This third method has the advantage of being completely transparent to the user, unlike the previous two methods. It is also a computationally efficient method. This third method has been further developed as described below.

This method can be adopted for continuum, shell, membrane, beam, as well as truss elements. The user interface is first described for cases when the pretension section is defined via the specification of continuum elements. Next, the user interface is described for cases when fasteners are modeled as beam or truss elements.

Pre-Tension Section Specified Using Continuum Elements - Overview

The pre-tension section may be specified using the option in the ABAQUS software as follows:

SURFACE DEFINITION, NAME=

Element number/element set label, face identifier label.

The face identifiers are necessary because the surface is internal to a body. The ABAQUS program then finds all elements that are underlying the section so that the correct stiffness/right-hand side alteration is performed. Elements such as beams, trusses, shell, membranes, springs, etc. are allowed to be connected to the pre-tension section. The only restrictions to properly determine which elements are underlying elements are that the user should not use any element other than continuum elements to describe the pre-tension section and that multi-point constraints that involve nodes of a pre-tension surface are generally not allowed.

As explained earlier, the tension across the pre-tension section is prescribed via a reference node which is designated in ABAQUS as a pre-tension node to distinguish it from rigid surface reference nodes. A pre-tension section must therefore be associated to a pre-tension node. The option:

PRE-TENSION SECTION, SURFACE=name, NODE=pre-tension
   node number optional normal to surface, is used for this purpose.

The user generally inputs the assembly load or tightening adjustment along the normal to the pre-tension surface. This normal may be defined by the user; if it is not defined, an average normal to the pre-tension section is computed. The pre-tension node possesses only one degree of freedom, along the normal, as the user considers the normal as the only direction of interest for the assembly load. The vector $U_R$ described earlier is replaced, in this case, by $\Delta l N$, where $\Delta l$ is the tightening adjustment of the section and N designates the normal to the section.

In ABAQUS, the application of the pre-tension via the pre-tension node will be a step dependent option using the standard *BOUNDARY and/or *CLOAD features, described in detail below. One possible way of obtaining the desired assembly load may be:

```
*STEP
apply the assembly load
*STATIC
*CLOAD
pretension node, 1, load value
.
.
*END STEP
*STEP
maintain assembly load, load other parts of structure
*STATIC
*BOUNDARY, FIXED, OP=MOD
Pretension node, 1
*END STEP
```

Pre-Tension Section Specified Using Beam or Truss Elements - Overview

The pre-tension section and association to a pre-tension node is specified using the option PRE-TENSION SECTION, ELEMENT=element number, NODE=
    pre-tension node number An optional normal to surface, is used for this purpose.

In this case, the pre-tension section is reduced to one node. This node will be the last node in the element connectivity. The user will be able to provide a normal, and if the user does not, a normal is automatically generated to be tangent to the beam or truss element. This case is a simple case, yet very important as users often utilize truss or beam elements to model bolts.

Additional Features - Overview

The following is a list of additional features supportable by the computer process for prescribing an assembly load to provide pre-tensioning simulation and design of structure:

- Output of stress across the pre-tension section. This requires to use the force information stored at the additional nodes "A1".
- Output of the forces across the section in three directions, not just the component normal to the section.
- Output of the moments carried across the pre-tension section, measured about a convenient point (often defined by the location of the pre-tension node).
- Extension of the capability to shell, and membrane elements. This requires the creation of side labels for each element.

Basic Process/Architecture

Figure 6:
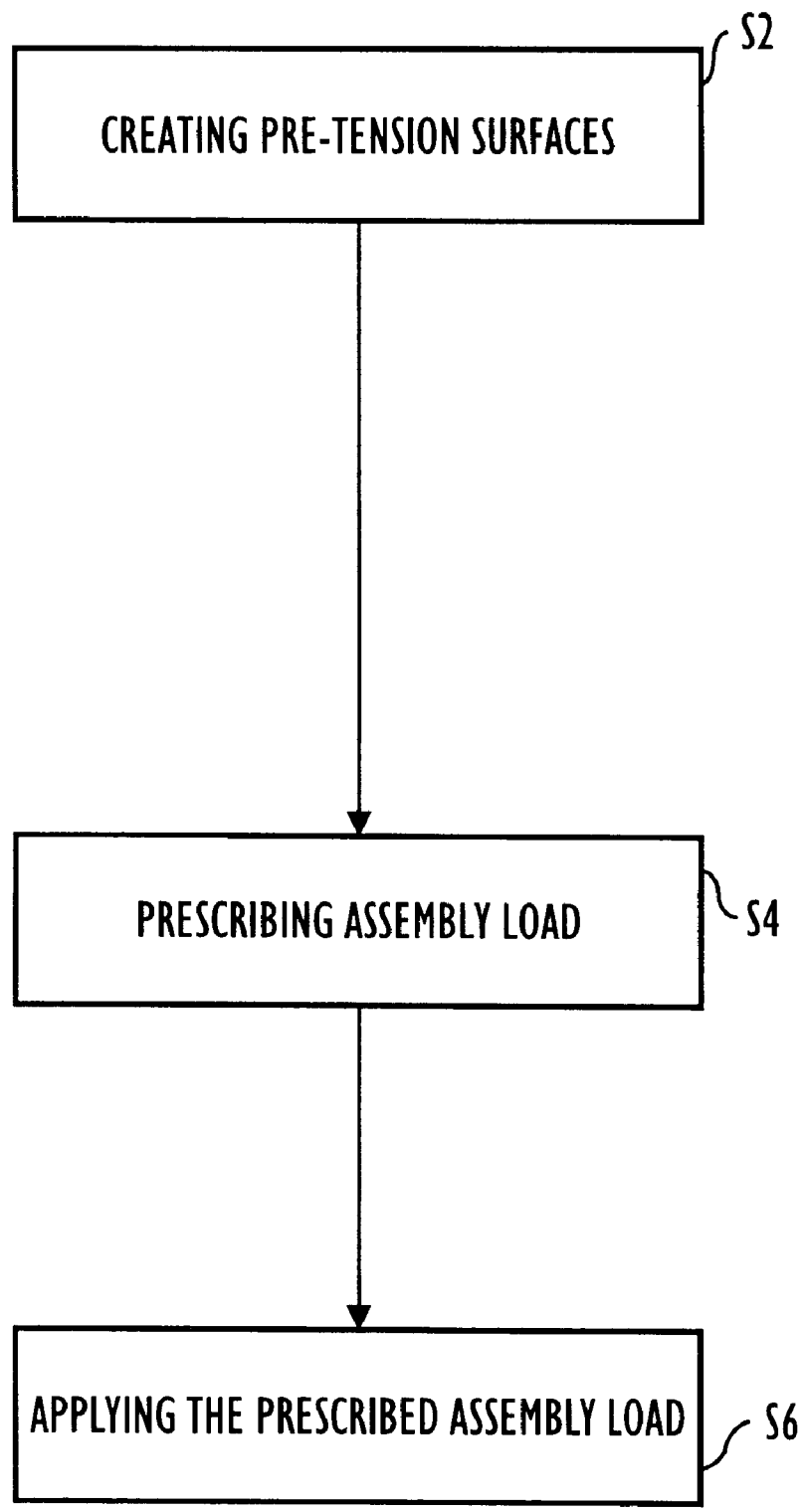
FIG. 6 is a flowchart of the basic process for prescribing an assembly load.

FIG. 6 is a flowchart of the basic process for prescribing an assembly load. In FIG. 6, each pre-tension surface that where the pre-tension force is to be applied is created in Step S2. The assembly loads are prescribed in Step S4. Once the assembly loads have been prescribed, they are applied to pre-tension surfaces in Step S6 that has been previously defined.

Figure 6A:
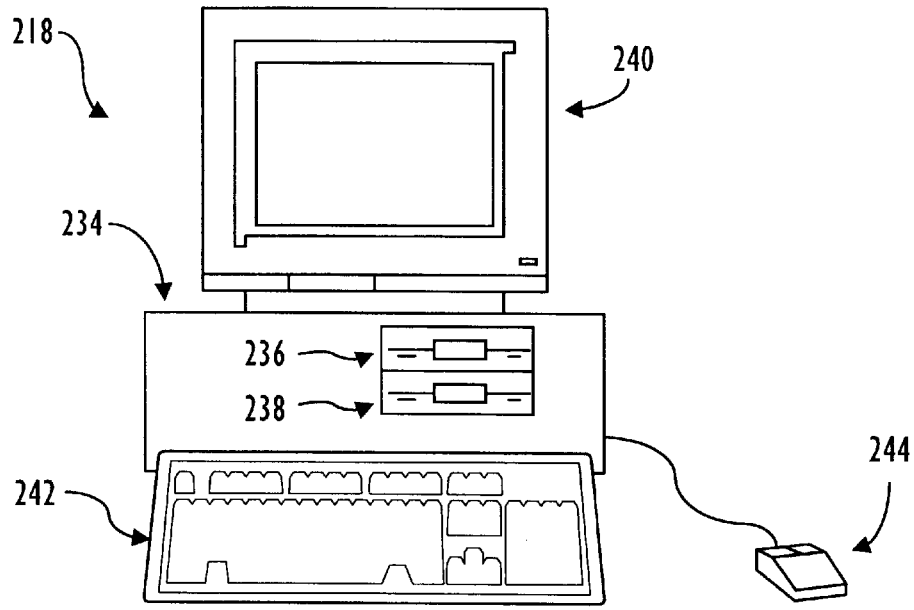
FIG. 6A is an illustration of main central processing unit for implementing the computer processing.

FIG. 6A is an illustration of main central processing unit 218 for implementing the computer processing in accordance with one embodiment of the present invention. In FIG. 6A, computer system 218 includes central processing unit 234 having disk drives 236 and 238. Disk drive indications 236 and 238 are merely symbolic of the number of disk drives which might be accommodated in this computer system. Typically, these would include a floppy disk drive such as 236, a hard disk drive (not shown either internally or externally) and a CD ROM indicated by slot 238. The number and type of drives varies, typically with different computer configurations. The computer includes display 240 upon which information is displayed. A keyboard 242 and a mouse 244 are typically also available as input devices via a standard interface.

Figure 6B:
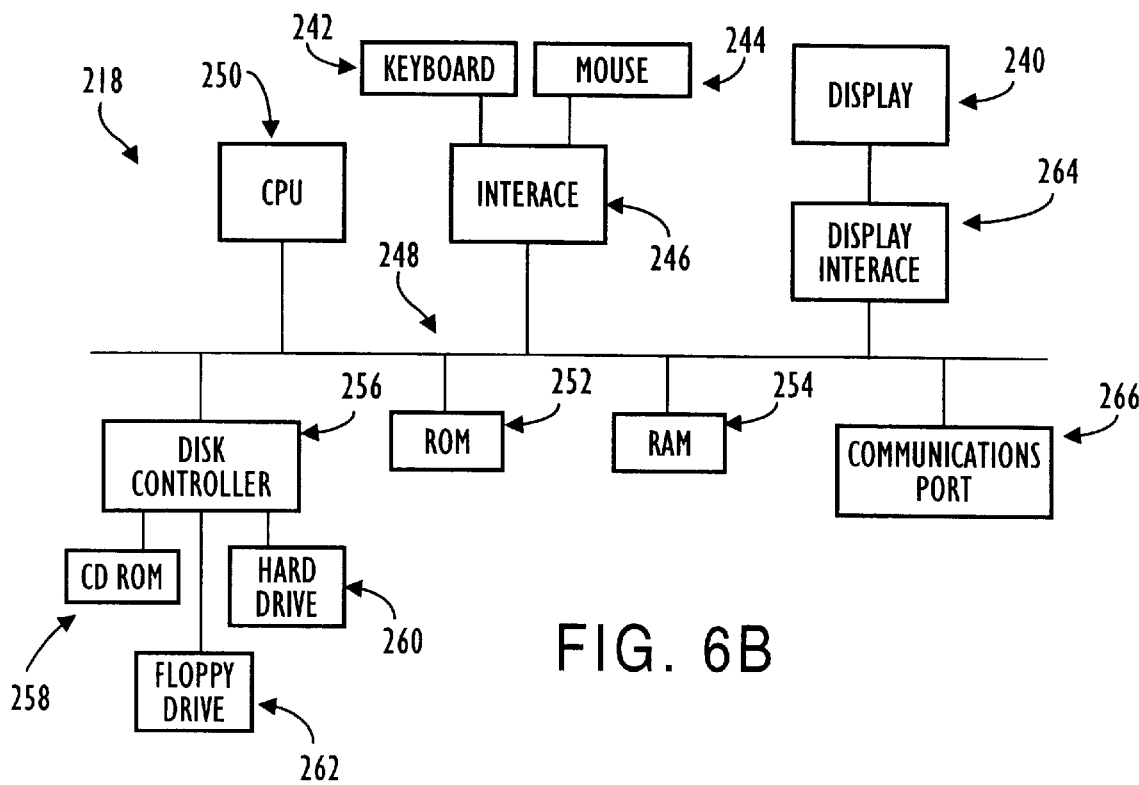
FIG. 6B is a block diagram of the internal hardware of the computer illustrated in FIG. 6A.

FIG. 6B is a block diagram of the internal hardware of the computer 218 illustrated in FIG. 6A. As illustrated in FIG. 6B, data bus 248 serves as the main information highway interconnecting the other components of the computer system. Central processing units (CPU) 250 is the central processing unit of the system performing calculations and logic operations required to execute a program. Read-only memory 252 and random access memory 254 constitute the main memory of the computer, and may be used to store the simulation data.

Disk controller 256 interfaces one or more disk drives to the system bus 248. These disk drives may be floppy disk drives such as 262, internal or external hard drives such as 260, or CD ROM or DVD (digital video disks) drives such as 258. A display interface 264 interfaces with display 240 and permits information from the bus 248 to be displayed on the display 240. Communications with the external devices can occur on communications port 266.

Figure 6C:
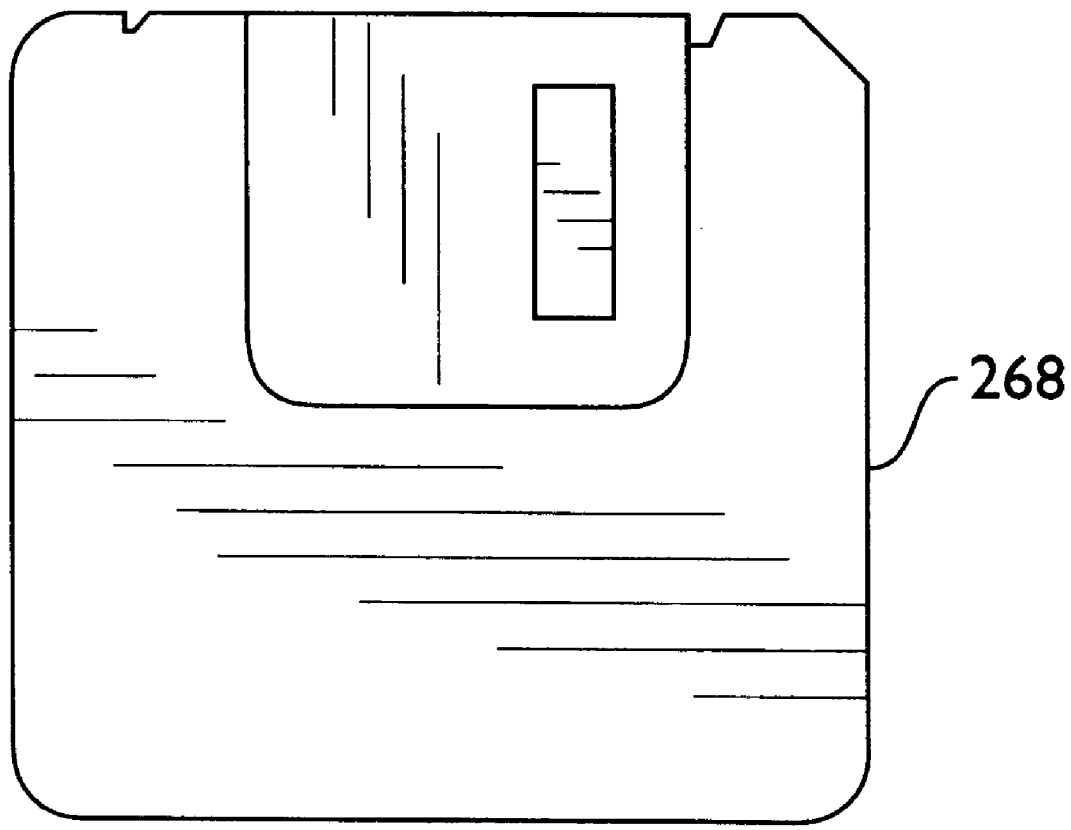
FIG. 6C is an illustration of an exemplary memory medium which can be used with disk drives illustrated in FIG. 6B or FIG. GA.

FIG. 6C is an illustration of an exemplary memory medium which can be used with disk drives such as 262 in FIG. 6B or 236 in FIG. 6A. Typically, memory media such as a floppy disk, or a CD ROM, or a digital video disk will contain, inter alia, the program information for controlling the computer to enable the computer to perform the testing and development functions in accordance with the computer system described herein.

Figure 7:
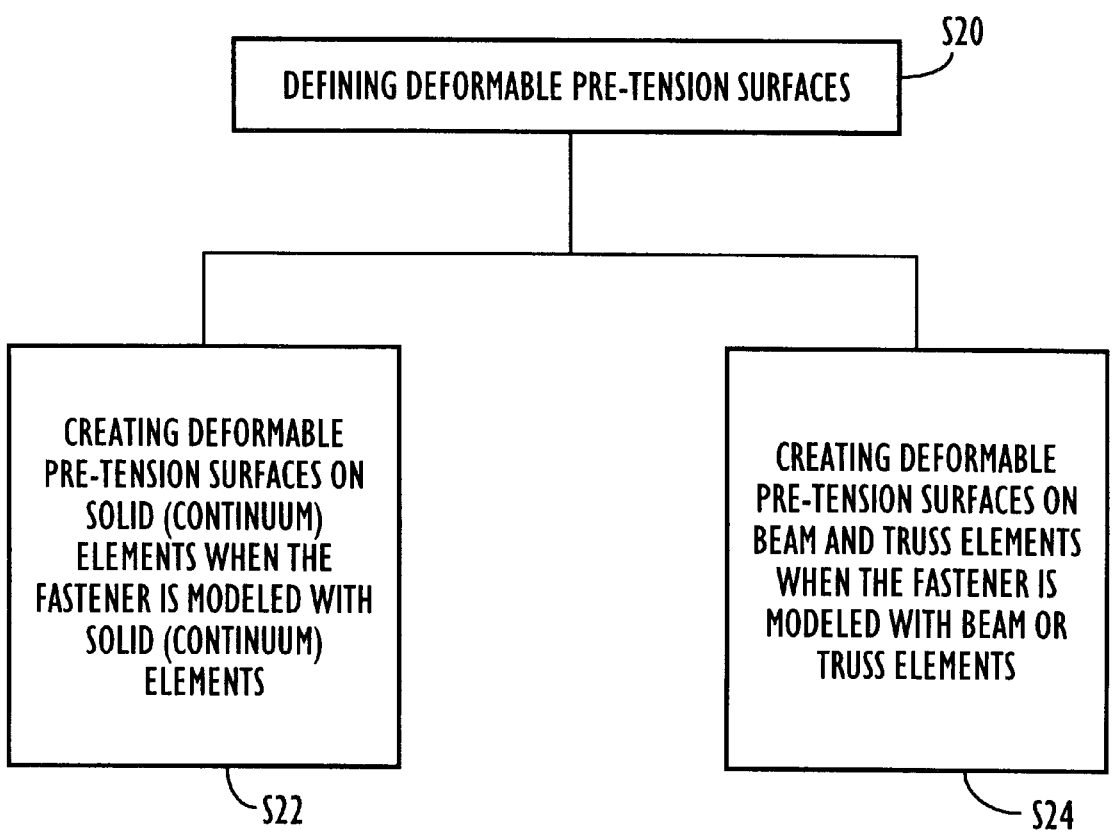
FIG. 7 is a flowchart of the general process of creating a deformable pre-tension surface for use in prescribing an assembly load to provide pre-tensioning simulation and design of structure.

FIG. 7 is a flowchart of the general process of creating a deformable surface for use in prescribing an assembly load to provide pre-tensioning simulation and design of a structure. In FIG. 7, the deformable pretension surface is defined in Step S20. The deformable pre-tension surface is created or specified, for example, on a solid element, such as a continuum element, in Step S22 when the fastener is modeled with solid (e.g., continuum) elements. Alternatively, in Step S24, the deformable pre-tension surface is created on, for example, structural elements, beam elements, truss elements, and the like, when the fastener is modeled with beam or truss elements. The above process is described in more detail below.

Prescribing Time Varying Assembly Loads and Tightening Adjustment

Assembly loads:

- may be used to simulate the loading of fasteners in a structure;
- require the specification of pre-tension sections across which the assembly loads are prescribed;
- require the specification of pre-tension nodes associated with the pre-tension sections; and
- require the specification of pre-tension loads or tightening adjustments on pre-tension nodes.

Complex time or frequency-dependent assembly loads and tightening adjustment may be specified as an amplitude variation by reference to an amplitude curve. If no amplitude variation or parameter is included, the total magnitude may be applied instantaneously at the start of the step and remain constant throughout the step (a "STEP" variation) or it may vary linearly over the step from the value at the end of the previous step (or zero, at the start of the analysis) to the magnitude given (a "RAMP" variation). The type of variation is chosen by setting the parameter AMPLITUDE=STEP or AMPLITUDE=RAMP on the *STEP option in ABAQUS.

Figure 8:
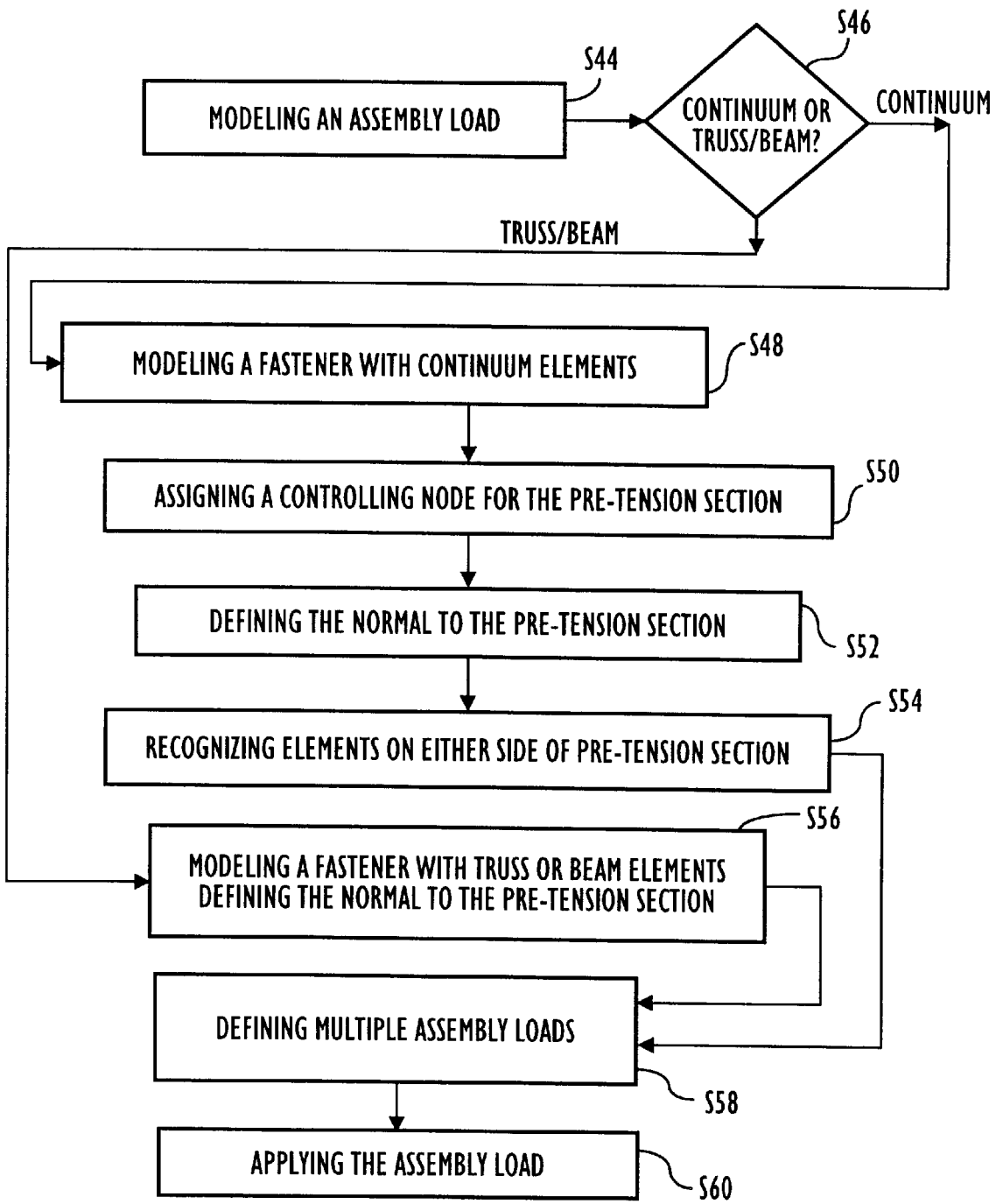
FIG. 8 is a flow chart of the general process of prescribing assembly loads for pre-tension simulation of an element or fastener.

The user is provided the capability to prescribe assembly loads across fasteners modeled by continuum, truss, or beam elements. The steps needed to model an assembly load vary slightly depending on the type of elements used to model the fasteners. FIG. 8 is a flow chart of the general process of prescribing assembly loads for pre-tension simulation of an element or fastener. In FIG. 8, the assembly load is modeled in Step S44, and it is determined whether the fastener is a continuum or truss/beam type of element in Step S46. If it is determined in Step S46 that the fastener is to be modeled using continuum elements, then the fastener is modeled with continuum elements in Step S48. A controlling node is assigned in Step S50 for the pre-tension section, and a normal is defined to the pre-tension section in Step S52. In Step S54, the elements on either side of pre-tension section are identified or recognized.

If it is determined in Step S46 that the fastener is to be modeled using truss/beam elements, then the fastener is modeled accordingly in Step S56, and a normal is defined with respect to the pre-tension section. Multiple assembly loads are optionally defined in Step S58, and the assembly load is applied in Step S60. This process is described in greater detail below.

Modeling a fastener with continuum elements

In continuum elements, the pre-tension section is defined as a surface inside the fastener and "cuts" it into two parts, FIG. 2. The pre-tension section may be a group of surfaces for cases where a fastener is composed of several segments.

As described above, the surface is defined, and the pre-tension section is applied with the pre-tension load. The surface is converted into a pre-tension section across which pre-tension loads may be applied. A controlling node is assigned for the pre-tension section as described below.

Figure 9:
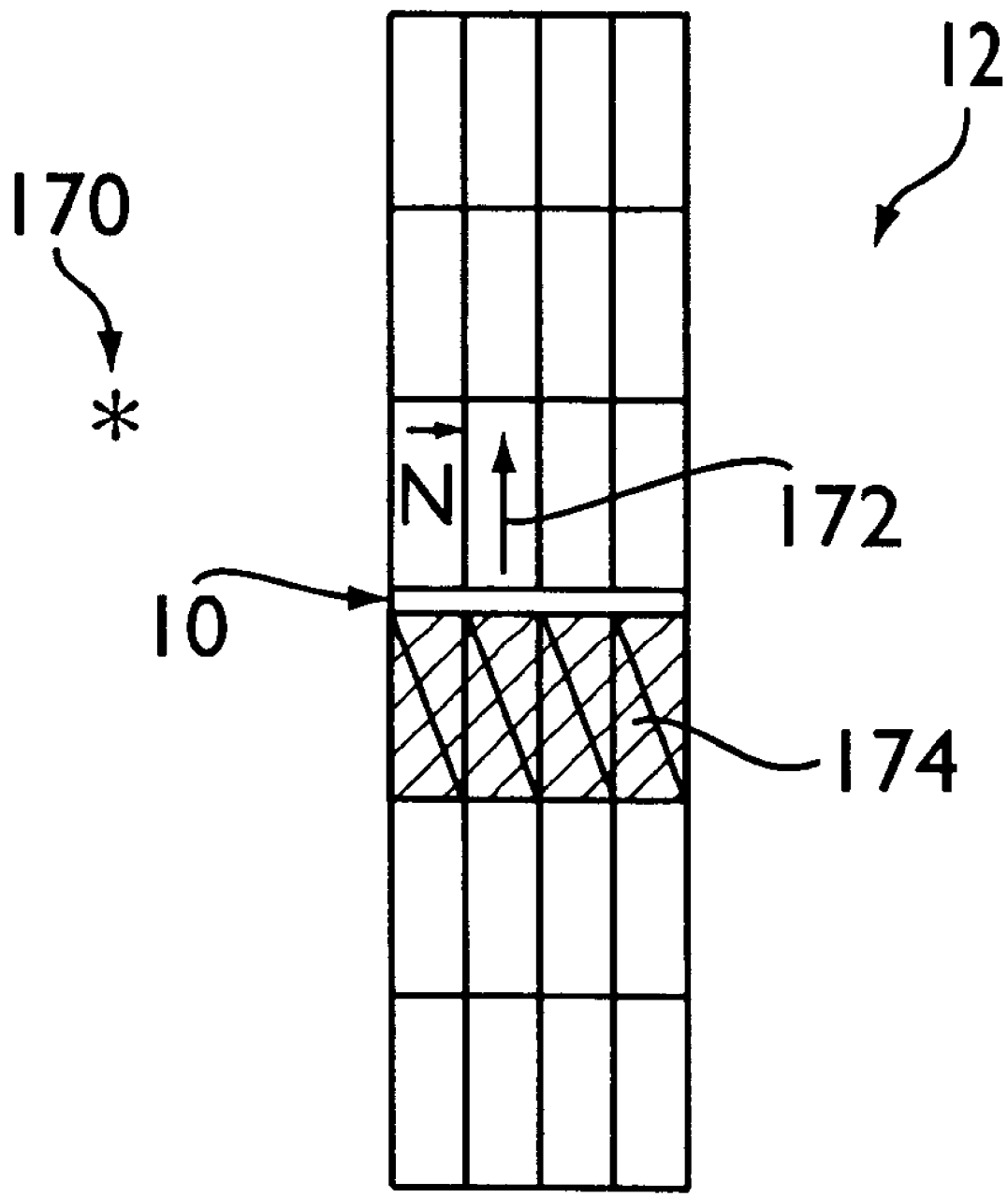
FIG. 9 is an illustration of an element with a normal to the pre-tension section facing away from underlying elements.

As illustrated in FIG. 9, the assembly load is transmitted across the pre-tension section 10 above selected elements 174 via the pre-tension node 170. The pre-tension node 170 should not generally be attached to any element in the model 12. It has only one (displacement) degree of freedom (degree of freedom 1) since the pre-tension is only applied in the direction of the normal 172 to the pre-tension section 10. The coordinates of this node are not generally important, although they may be if it is used as the reference point to report the moments transmitted through pre-tension section 10.

The normal 172 to the pre-tension section 10 may be defined by computing an average normal to the section 10, or may be given by the user. For all the elements that are connected to the pre-tension section by at least one node, it will be determined on which side of the pre-tension section each element is located. This process is important for the prescribed assembly load to work properly.

Modeling a fastener with truss or beam elements

When a prescribed assembly load is modeled with truss or beam elements, the pre-tension section is reduced to a point. The section is orthogonal to the beam or truss element and is assumed to be located at the last node in the element connectivity. As a result, the section is defined entirely by specifying the element to which an assembly load must be prescribed. The user specifies the beam or truss element and associates it with a pre-tension node.

Figure 10:
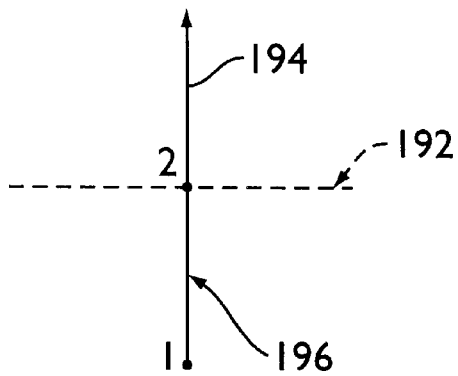
FIG. 10 is an illustration of a pre-tension section defined using a truss or beam element.

This node has only one (displacement) degree of freedom (degree of freedom 1) since the pre-tension section 192 is controlled only along its normal 194 for beam or truss element 196, as illustrated in FIG. 10. The coordinates of this node are not important, except when it is used as a reference point to report any moment transmitted across the pre-tension section. The normal vector 194 may be computed from the first to the last node in the element connectivity. Alternatively, the user can prescribe the normal to the section.

Applying the Prescribed Assembly Load

Figure 11:
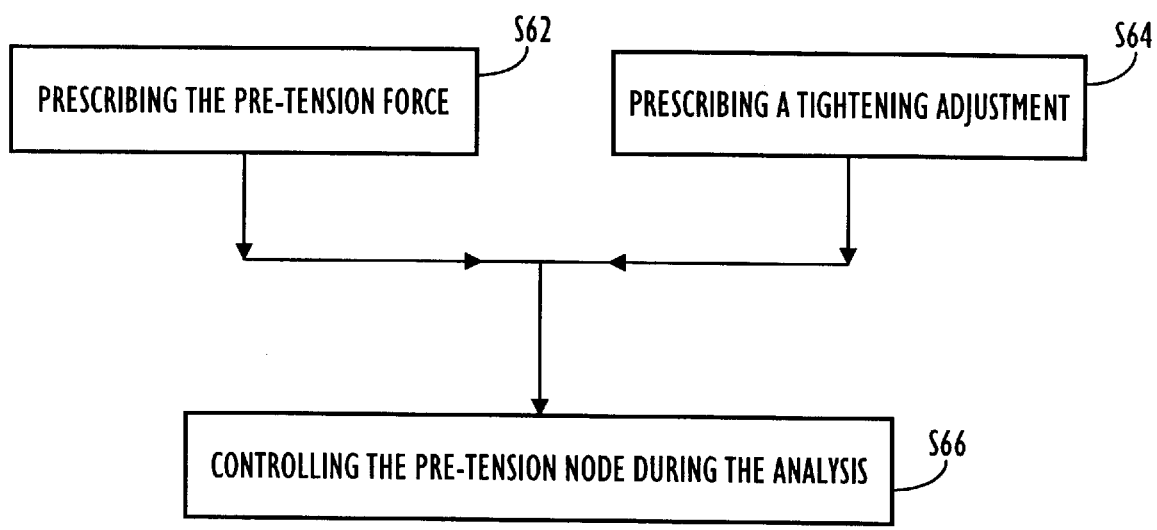
FIG. 11 is a flow chart of the general process of applying the prescribed load for the pre-tension simulation.
Figure 13A:
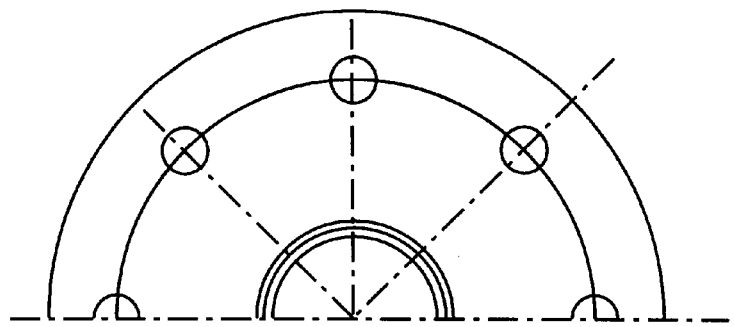
FIG. 13 is an illustration of a bolted joint schematic.
Figure 13B:
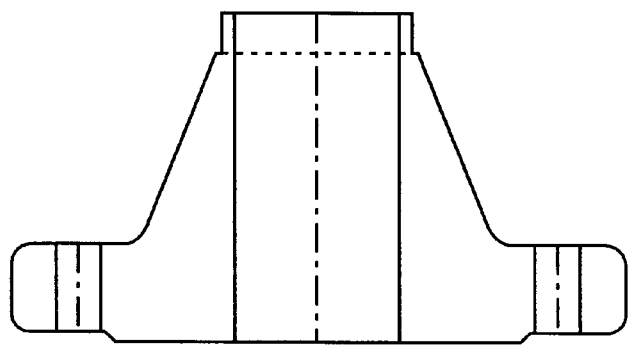
Figure 13C:
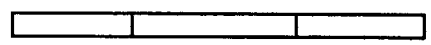
Figure 13D:
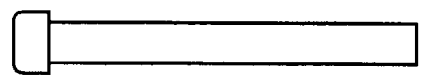

The pre-tension load is transmitted across the pre-tension section via the pre-tension node. FIG. 11 is a flow chart of the general process of applying the prescribed load for the pre-tension simulation. In FIG. 11, the pre-tension force is prescribed in Step S62, or a tightening adjustment is prescribed in Step S64. The pre-tension node is then controlled in Step S66.

Figure 12:
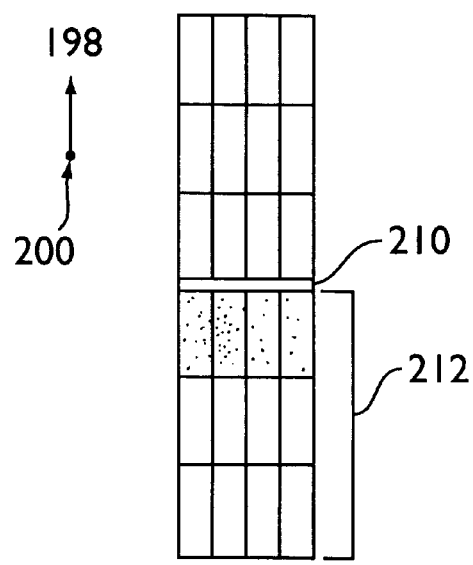
FIG. 12 is an illustration of a prescribed assembly load given at the pre-tension node.

A concentrated load may be applied to the pre-tension node 200, illustrated in FIG. 12. This load is the force 198 acting in the direction of the normal on the elements 212 of the fastener underlying the pre-tension section 210 and onto the part that contains the elements which were used in the definition of the pre-tension section.

A tightening adjustment of the pre-tension section may be defined by prescribing a displacement at the pre-tension node. This displacement is applied along the normal to the pre-tension section, and represents the motion of the underlying elements relative to the other elements connected to the pre-tension section.

The initial adjustment of the pre-tension section can be maintained and controlled once the initial pre-tension is applied in the fastener. This enables the load across the pre-tension section to change according to the externally applied loads in order to maintain equilibrium. If the initial adjustment of a section is not maintained, the force in the fastener will remain constant.

When more than one pre-tension section has been defined, loads or tightening adjustments may be prescribed sequentially or simultaneously at the pre-tension nodes. Static analysis is the most likely analysis procedure type to be used when prescribing the initial pre-tension. Once the initial pre-tension is applied, a procedure such as static or dynamic analysis is generally used to apply additional loads while maintaining the tightening adjustment. The total force across the pre-tension section is the sum of the reaction force at the pre-tension node plus any concentrated load at that node.

The tightening adjustment of the pre-tension section is available as the displacement of the pre-tension node. Only the adjustment normal to the pre-tension section is output since the adjustment in directions transverse to the normal is zero.

Sample Template in ABAQUS For Applying Assembly Loads in the Case of One Pre-Tensioned Element Only
*HEADING
Prescribed assembly load; example using continuum elements
*NODE
Optionally define the pre-section node
*SURFACE DEFINITION, NAME=name
Data lines which give the elements and their associated faces to define the pre-tension section
*PRE-TENSION SECTION, SURFACE=name, NODE= pre-tension node
**
*STEP
**Application of the pre-tension across the section
*STATIC
Data line to control time incrementation
*CLOAD
pre-tension node, 1, pre-tension value
or
*BOUNDARY, AMPLITUDE=amplitude
pre-tension node, 1,1, tightening adjustment
No other loads or boundary conditions may be applied to the pre-tension node
*END STEP
*STEP
** maintain the tightening adjustment and apply new loads
*STATIC or *DYNAMIC
Data line to control time incrementation
*BOUNDARY, FIXED
pre-tension node, 1, 1
*BOUNDARY
Data lines to prescribe other boundary conditions
*CLOAD or *DLOAD
Data lines to prescribe other loading conditions
. . .
*END STEP Axisymmetric Analysis of Bolted Pipe Flange Connections The bolted pipe flange connection is a common and important part of many piping systems. Such connections are typically composed of hubs of pipes, pipe flanges with bolt holes, set of bolts and nuts, and a gasket. These components interact with each other in the tightening process and when operation loads such as internal pressure and temperature are applied. Experimental and numerical studies on different types of interaction among these components are frequently reported in the literature.

The studies include analyses of the bolt-up procedure that yields uniform bolt stress (Bibel, G. D. and R. M. Exell, "An improved Flange Bolt-Up Procedure Using Experimentally Determined Elastic Interaction Coefficients," Journal of Pressure Vessel Technology, vol. 114, pp. 439–443, 1992), contact analysis of screw threads (Fukuoka, T., "Finite Element Simulation of Tightening Process of Bolted Joint with a Tensioner," Journal of Pressure Vessel Technology, vol. 114, pp. 433–438, 1992; Chaaban, A. and U. Muzzo, "Finite Element Analysis of Residual Stresses in Threaded End Closures," Transactions of ASME, vol. 113, pp. 398–401, 1991), and full stress analysis of the entire pipe joint assembly (Sawa, T., N. Higurashi, and H. Akagawa, "A Stress Analysis of Pipe Flange Connections," Journal of Pressure Vessel Technology, vol. 113, pp. 497–503, 1991), all of which are incorporated herein by reference.

To establish an optimal design, a full stress analysis determines factors such as the contact stresses which govern the sealing performance, the relationship between bolt force and internal pressure, the effective gasket seating width, and the bending moment produced in the bolts. This example shows how to perform such a design analysis by using an economical axisymmetric model, and how to assess the accuracy of the axisymmetric solution by comparing the results obtained by a simulation using a three-dimensional segment model.

The bolted joint assembly being analyzed is depicted in FIG. 13. The geometry and dimensions of the various parts are taken from Sawa et al. (1991), modified slightly to simplify the modeling. The inner wall radius of both the hub and gasket is 25 mm. The outer wall radii of the pipe flange and the gasket are 82.5 mm and 52.5 mm, respectively. The thickness of the gasket is 5 mm. The pipe flange has eight bolt holes, which are equally spaced in the pitch circle of radius 65 mm. The radius of the bolt hole is modified in this analysis to be the same as that of the bolt, 8 mm. The bolt head (bearing surface) is assumed to be circular and its radius is 12 mm.

Young's modulus is 206 GPa for both the bolt and the pipe hub/flange, and is 68.7 GPa for the gasket. Poisson's ratio is 0.3 for all materials. Sticking contact conditions are assumed in all contact areas: between the bearing surface and the flange, and between the gasket and the hub. Contact between the bolt shank and the bolt hole is ignored.

Figure 14:
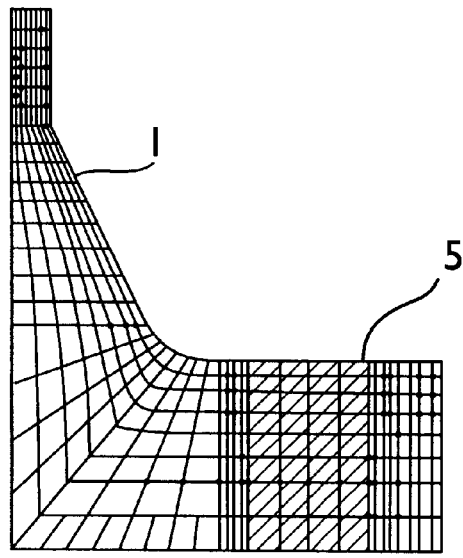
FIGS. 14–15 are illustrations of an axisymmetric model of the bolted joint without and with the bolt, respectively.
Figure 15:
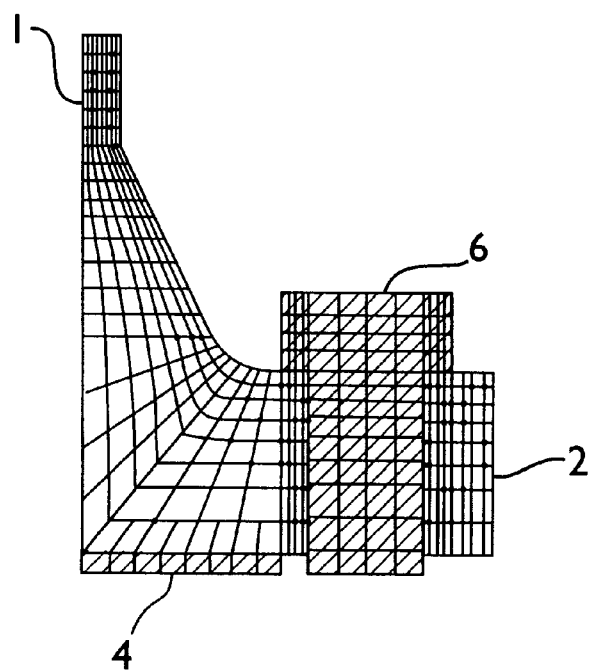

The finite element idealizations of the symmetric half of the pipe joint are shown in FIGS. 14–17. FIGS. 14–15 correspond to the axisymmetric model of the bolted joint, and FIGS. 16–17 correspond to the three-dimensional analyses, respectively. The mesh used for the axisymmetric analysis consists of a mesh for the pipe hub/flange and gasket, and a separate mesh for the bolts.

Figure 16:
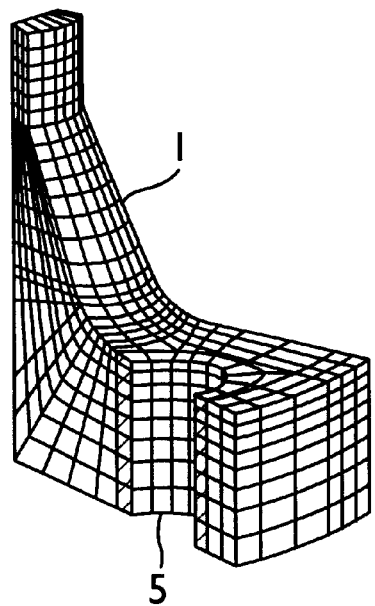
FIGS. 16–17 are illustrations of a three-dimensional model of the bolted joint without and with the bolt, respectively.
Figure 17:
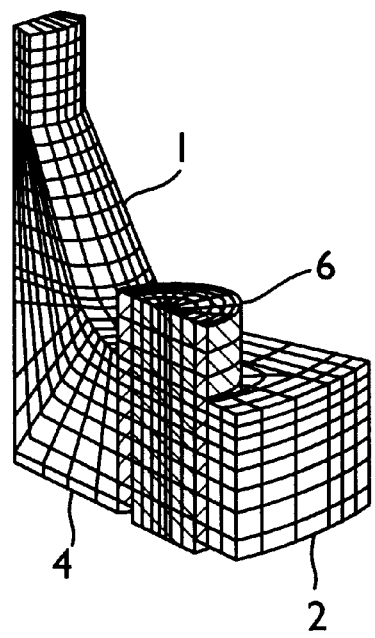

FIGS. 14 and 16 illustrate the mesh of the pipe hub and flange 1 with the bolt area shown at location 5. FIGS. 15 and 17 illustrate the overall mesh with the gasket 4 and the bolt 6 in place.

Second-order axisymmetric elements with reduced integration are used throughout the mesh of the pipe hub/flange and gasket. Contact between the gasket and the pipe hub/flange is modeled by contact pairs between pairs of surfaces defined from the faces of elements in the contact region or between such surfaces and contact node sets. In an axisymmetric analysis, the bolts and the perforated flange must be modeled properly. The bolts are modeled as plane stress elements since they do not carry hoop stress.

Second-order plane stress elements with reduced integration are employed for this purpose. The contact surface definitions, which are associated with the faces of the elements, account for the plane stress condition automatically. To account for all eight bolts used in the joint, the combined cross-sectional areas of the shank and the head of the bolts must be calculated and redistributed to the bolt mesh appropriately, via the area attributes for the solid elements. The contact area is adjusted automatically.

Figure 18A:
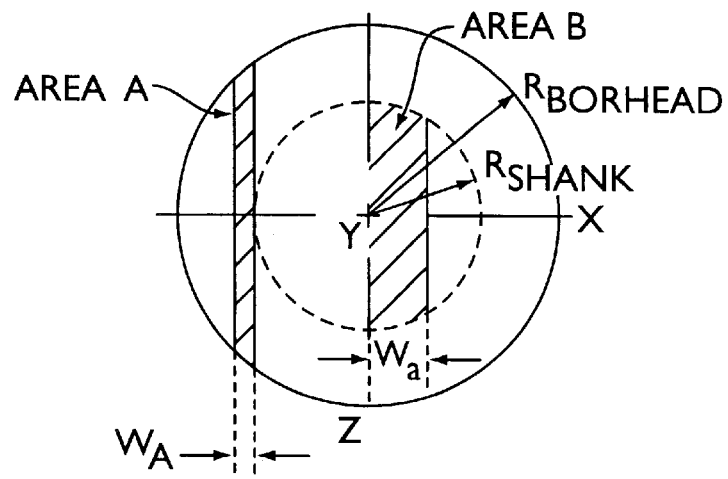
FIG. 18 illustrates the cross-sectional views of the bolt head and the shank.
Figure 18B:
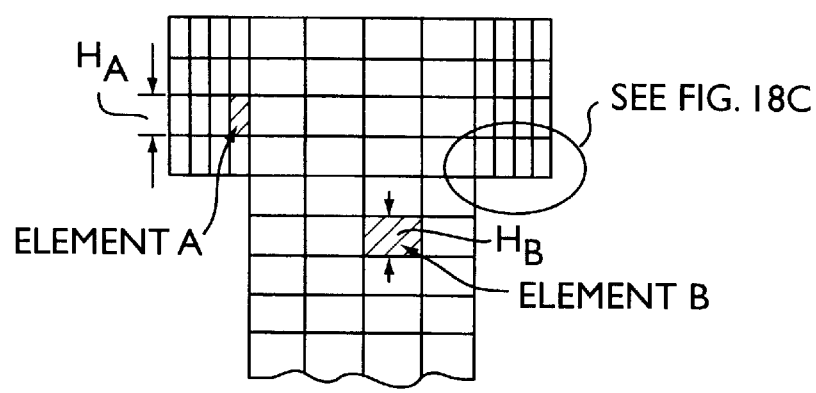
Figure 18C:
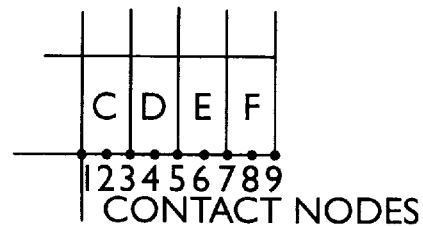

FIG. 18 illustrates the cross-sectional views of the bolt head and the shank. Each plane stress element represents a volume that extends out of the x-y plane. For example, element A represent a volume calculated as $(H_A) \times (Area_A)$. Likewise, element B represents a volume calculated as $(H_B) \times (Area_B)$. The sectional area in the x-z plane pertaining to a given element may be calculated as $$\text{Area} = 2\int_{x_1}^{x_2}\left[(R^2 - x^2)^{\frac{1}{2}}\right]dx = \left[x(R^2 - x^2)^{\frac{1}{2}} + R^2 a\sin\left(\frac{x}{|R|}\right)\right]\bigg|_{x_2}^{x_1},$$

where R is the bolt radius, $R_{bolthead}$ or $R_{shank}$ (depending on the element location), and $X_1$ and $X_2$ are x-coordinates of the left and right side of the given element, respectively. The "asin" term must be calculated in terms of radians.

If the sectional areas are divided by the respective element widths, $W_A$ and $W_B$, we obtain representative element thicknesses. Multiplying each element thickness by 8 (the number of bolts in the model) produces the thickness values.

Sectional areas associated with bolt head elements located on the model's contact surfaces are used to calculate the surface areas associated with the contact nodes defined in the model. Referring again to FIG. 18, nodal contact areas for a single bolt are calculated as follows:

$$A_1 = \frac{A_C}{4}, A_9 = \frac{A_F}{4},$$

$$A_2 = \frac{A_C}{2}, A_4 = \frac{A_D}{d}, A_6 = \frac{A_E}{2}, A_8 = \frac{A_F}{2},$$

$$A_3 = (A_C + A_D)/4, A_5 = (A_D + A_E)/4, A_7 = (A_3 + A_F)/4,$$

where $A_1$ through $A_9$ are contact areas associated with contact nodes 1–9 and $A_C$ through $A_F$ are sectional areas associated with bolt head elements C–F. Multiplying the above areas by 8 (the number of bolts in the model) provides the nodal contact areas.

The presence of the bolt holes in the pipe flange makes the flange material inhomogeneous. A common way of handling this is axisymmetric analyses is to smear the material properties used in the bolt hold area of the mesh and to use material properties corresponding to a weaker material in this region. General guidelines for determining the effective material properties for perforated flat plates are found in ASME Section VIII Div 2 Article 4–9.

For the type of structure under study, which is not a flat plate, a common approach to determining the effective material properties is to calculate the elasticity moduli reduction factor, which is the ratio of the ligament area in the pitch circle to the annular area of the pitch circle. In this model, the annular area of the pitch circle is given by AA=6534.41 mm², and the total area of the bolt holes is given by AH=8π8²=1608.5 mm². Hence, the reduction factor is simply 1−AH/AA=0.754.

The effective in-plane moduli of elasticity, E1' and E2', are obtained by multiplying the respective moduli, E1 and E2, by this factor. We assume material isotropy in the r–z plane and so E1'=E2'=E'. The modulus in the hoop direction, E3', should be very small and is chosen such that E'/E3'=$10^6$. The in-plane shear modulus is then calculated based on the effective elasticity modulus: $G'_{12}$=E'/2(1+υ). The shear moduli in the hoop direction are also calculated similarly, but with υ set to zero. (They are not used in an axisymmetric model.) Hence, we have E1'=E2'=155292 MPa, E3'= 0.155292 MPa, $G'_{12}$=59728 MPa and $G'_{13}$=$G'_{23}$=0.07765 MPa.

The mesh for the three-dimensional analysis, shown in FIGS. 16–17, represents a 22.5° segment of the pipe joint and employs second-order brick elements with reduced integration everywhere. Contact is modeled by the interaction of contact surfaces defined by grouping specific faces of the elements in the contacting regions. For three-dimensional contact where both the master and slave surfaces are deformable, small relative sliding occurs between contacting surfaces. No special adjustments need be made for the material properties used in the three-dimensional model because all parts are modeled appropriately.

The only boundary conditions are symmetry boundary conditions. In the axisymmetric model $u_x$=0 is applied to the symmetry plane of the gasket and to the bottom of the bolts. In the three-dimensional model $u_y$=0 is applied to the symmetry plane of the gasket as well as to the bottom of the bolt. The θ=0° and θ=22.5° planes are also symmetry planes. Since mesh refinement MPCs (Multi Point Constraints) are present in the three-dimensional mesh with some MPCs involving nodes on these symmetry planes, suitable nodal transformation and application of boundary conditions to local directions in these symmetry planes cannot be easily performed.

On the θ=0° plane, symmetry boundary $u_2$=0 are imposed everywhere except for the dependent nodes associated with the MPC and nodes on one side of the contact surface. These exceptions are made to avoid over-constraining problems, which arise if a boundary condition exists in the same direction as a Lagrange multiplier constraint. On the θ=22.5° plane, the symmetry boundary conditions are enforced with the constraint equation, $u_2$+$u_2$tan(π/8)=0, everywhere except the dependent MPC nodes.

A clamping force of 15 kN is applied to each bolt. The section is first identified; the actual load to the pre-tension section is prescribed in the static step by applying a concentrated load on the pre-tension node. In the axisymmetric analysis the actual load applied is 120 kN since there are a total of eight bolts. In the three-dimensional model, the actual load applied is 7.5 kN, since only half of a bolt is modeled. For both models the pre-tension section is specified about half-way down the bolt shank. Sticking contact conditions are assumed in all surface interactions in both analyses, and are also simulated.

All analyses are performed as small displacement analyses. The nonlinearities in the problem are due to the presence of contact conditions. The results obtained match those reported by Sawa et al. (1991) fairly closely.

Figure 19:
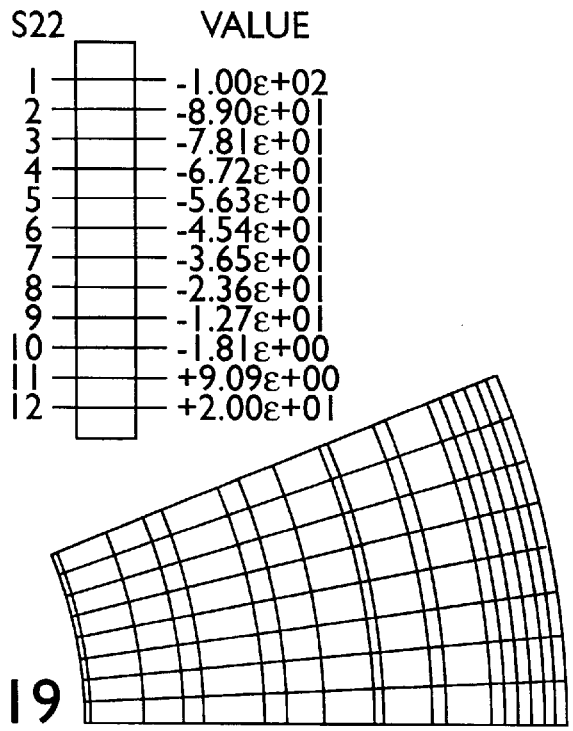
FIG. 19 shows a top view of the normal stress distributions in the gasket at the interface between the gasket and the pipe hub/flange predicted by the axisymmetric analyses.
Figure 20:
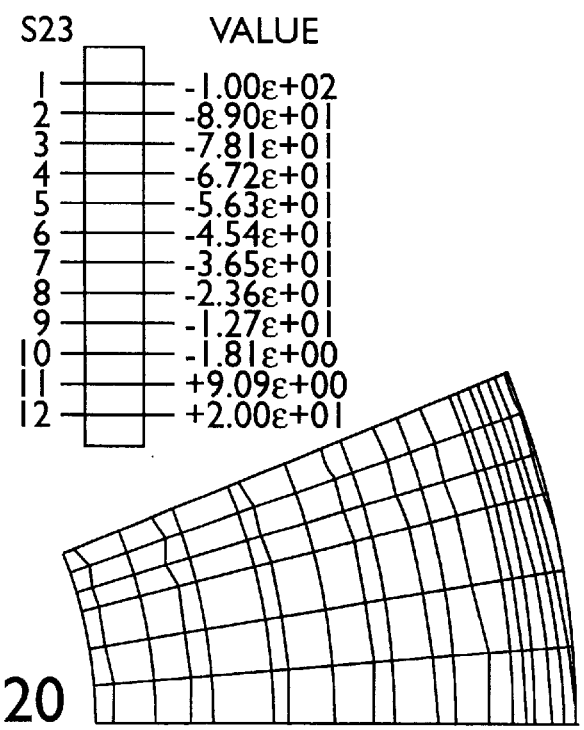
FIG. 20 shows a top view of the normal stress distributions in the gasket at the interface between the gasket and the pipe hub/flange predicted by the three-dimensional analyses.

FIG. 19 shows a top view of the normal stress distributions in the gasket at the interface between the gasket and the pipe hub/flange predicted by the axisymmetric analyses. FIG. 20 shows a top view of the normal stress distributions in the gasket at the interface between the gasket and the pipe hub/flange predicted by the three-dimensional analyses. FIGS. 19–20 show that the normal stress is highest at the outer edge of the gasket, decreases radially inward, and changes from compression to tension at a radius of about 35 mm. This is consistent with findings reported by Sawa et al. (1991).

In summary, the close agreement in all overall solution between axisymmetric and three-dimensional analyses is quite apparent, indicating that, for such problems, axisymmetric analysis offers a simple yet reasonably accurate alternative to three-dimensional analysis. The models in this example can be modified to study other factors, such as the effective seating width of the gasket or the sealing performance of the gasket under operation loads.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A computer implemented process for simulating a tension in an element of an assembly, comprising the steps of:
    (a) defining a finite element model for the element;
    (b) creating a pre-tension surface within the finite element model of the element;
    (c) prescribing conditions relative to the pro-tension surface including prescribing an assembly load including either a tension force or a tightening adjustment as one of the conditions;
    (d) applying the assembly load to the pretension surface to simulate the assembly load in the element of the assembly;
    (e) outputting computed results to be used in the evaluation of the assembly with respect to said applying step (d) for structural integrity.

2. A computer implemented process according to claim 1, wherein said outputting step (e) provides information usable to assist in a redesign of the assembly with respect to structural integrity.

3. A computer implemented process according to claim 1, wherein said prescribing step (c) further comprises the step of prescribing the assembly load as the one of the conditions in a single step procedure.

4. A computer implemented process according to claim 1, wherein said prescribing step (c) further comprises the step of prescribing the assembly load as the one of the conditions without modifying the pre-tension surface within the finite element model of the element.

5. A computer implemented process according to claim 1, wherein said prescribing step (c) further comprises the step of prescribing the assembly load as the one of the conditions without separating the element into different components.

6. A computer implemented process according to claim 1, wherein said applying step (d) further comprises the step of applying the assembly load to the pre-tension surface to simulate the tension in the element of the assembly during a substantially nonlinear response of the element.

7. A computer implemented process according to claim 1,
    wherein said defining step (a) further comprises the step of defining a standard finite element model for the element to simulate the tension in the element of the assembly, and
    wherein said prescribing step (c) further comprises the step of prescribing the assembly load as the one of the conditions without modifying the standard finite element model of the element.

8. A computer implemented process according to claim 1, wherein said prescribing step (c) further comprises the step of prescribing the assembly load in any direction to be applied to the element in said applying step (d).

9. A computer implemented process according to claim 1, wherein said outputting step (e) further comprises the step of capturing load paths resulting from applying the assembly load to the element.

10. A computer implemented process according to claim 1, further comprising the step of measuring the assembly load to evaluate the element of the assembly for structural integrity.

11. A computer implemented process according to claim 1, wherein said prescribing step (c) further comprises the step of prescribing boundary conditions relative to the pre-tension surface for applying the tension force including prescribing the assembly load as the one of the boundary conditions.

12. A computer implemented process according to claim 1, wherein:
the assembly load comprises a plurality of assembly loads, said prescribing step (c) further comprises the step of successively prescribing the plurality of assembly loads as the one of the conditions,
said applying step (d) further comprises the step of successively applying the plurality of assembly loads to the pre-tension surface of the element to simulate the tension in the element of the assembly for each of the plurality of assembly loads, and
said outputting step (e) further comprises the step of successively outputting the element of the assembly with respect to said successively applying step for each of the plurality of assembly loads for structural integrity.

13. A computer implemented process according to claim 12, wherein said successively prescribing, successively applying, and successively outputting steps are performed independently.

14. A computer implemented process according to claim 12, wherein:
the assembly includes a plurality of elements, and
said successively prescribing, successively applying, and successively outputting steps are performed independently for each of the plurality of elements in the assembly.

15. A computer implemented process for simulating a tension in an element of an assembly, comprising the steps of:
(a) defining a simulation model for the element;
(b) creating a pre-tension surface in the simulation model of the element;
(c) prescribing boundary conditions relative to the pre-tension surface for applying the tension force including prescribing an assembly load including either a tension force or a tightening adjustment as one of the boundary conditions;
(d) applying the assembly load to the pre-tension surface to simulate the tension in the element of the assembly; and
(e) outputting computed results to be used in the evaluation of the assembly with respect to said applying step (d).

16. A computer implemented process for simulating a tension in an element of an assembly, comprising the steps of:

(a) prescribing boundary conditions for the element including prescribing an assembly load as one of the boundary conditions, the assembly load including either a tension force or a tightening adjustment;
(b) applying the assembly load to the element to simulate the tension in the element of the assembly; and
(c) outputting computed results to be used in the evaluation of the element of the assembly with respect to said applying step (b).

17. A computer implemented process for simulating independent tensions in a plurality of elements of an assembly, comprising the steps of:
(a) defining a simulation model for each of the plurality of elements;
(b) prescribing an assembly load including either a tension force or a tightening adjustment for each of the elements using the simulation model for applying a tension force;
(c) independently and successively applying the assembly load to each of the plurality of elements using the simulation model to simulate the tension in each of the plurality of elements of the assembly; and
(d) independently and successively outputting computed results to be used in the evaluation of each of the plurality of elements of the assembly with respect to said applying step (c).

18. A computer implemented process for simulating a tension in an element of an assembly, comprising the steps of:
(a) defining a simulation model for the element;
(b) prescribing a plurality of assembly loads for the element using the simulation model for applying a tension force, each of the plurality of assembly loads including either a tension force or a tightening adjustment;
(c) independently and successively applying each of the plurality of assembly loads to the element using the simulation model to simulate the tension in the element of the assembly; and
(d) independently and successively outputting computed results to be used in the evaluation of the element of the assembly with respect to said applying step (c).

19. A computer readable tangible medium storing instructions for implementing a process driven by a computer, the instructions controlling the computer to perform the process of simulating a tension in an element of an assembly, said computer readable tangible medium storing the instructions controlling the computer to implement the following:
(a) defining a finite element model for the element;
(b) creating a pre-tension surface in the finite element model of the element;
(c) prescribing conditions relative to the pre-tension surface for applying the tension force including prescribing an assembly load in the form either of a tension force or a tightening adjustment as one of the conditions;
(d) applying the assembly load to the pre-tension surface to simulate the tension in the element of the assembly; and
(e) outputting computed results to be used in the evaluation of the assembly with respect to said applying step (d) for structural integrity.

* * * * *